US010295709B2

(12) United States Patent
Hsu

(10) Patent No.: US 10,295,709 B2
(45) Date of Patent: May 21, 2019

(54) BLACK MATRIX, FLAT PANEL DISPLAY DEVICE AND METHOD FOR PRODUCING THE SAME

(71) Applicant: BOE TECHNOLOGY GROUP CO., LTD., Beijing (CN)

(72) Inventor: MingHung Hsu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/120,724

(22) PCT Filed: Aug. 27, 2015

(86) PCT No.: PCT/CN2015/088259
§ 371 (c)(1),
(2) Date: Aug. 22, 2016

(87) PCT Pub. No.: WO2016/145787
PCT Pub. Date: Sep. 22, 2016

(65) Prior Publication Data
US 2017/0010392 A1   Jan. 12, 2017

(30) Foreign Application Priority Data

Mar. 18, 2015   (CN) .......................... 2015 1 0119208

(51) Int. Cl.
*G02B 5/00* (2006.01)
*H01L 51/56* (2006.01)
(Continued)

(52) U.S. Cl.
CPC .............. *G02B 5/003* (2013.01); *G02B 5/00* (2013.01); *G02B 5/0808* (2013.01); *H01L 27/32* (2013.01);
(Continued)

(58) Field of Classification Search
CPC ........ G02B 5/00; G02B 5/003; G02B 5/0808; G02B 5/22; G02B 5/223; H01L 27/28; H01L 27/32
(Continued)

(56) References Cited

U.S. PATENT DOCUMENTS 6,208,791 B1 *  3/2001  Bischel .............. G02B 6/12004
                                                        385/123
7,745,996 B2 *  6/2010  Lim ........................ G02B 5/22
                                                        313/110
(Continued)

FOREIGN PATENT DOCUMENTS

CN       101101844 A     1/2008
CN       100446296 C    12/2008
(Continued)

OTHER PUBLICATIONS

International Search Report and Written Opinion (including English translation of Box V) dated Dec. 15, 2016, for corresponding PCT Application No. PCT/CN2015/088259.
(Continued)

*Primary Examiner* — Willam R Alexander
(74) *Attorney, Agent, or Firm* — Kinney & Lange, P.A.

(57) ABSTRACT

The present disclosure provides a black matrix, a flat panel display device including the black matrix and a method for producing the same. The black matrix is arranged on a surface of a substrate located in a first plane, the black matrix including: a light absorption layer, a microstructure layer and a light reflection layer, the absorption layer being formed between the microstructure layer and the surface of the substrate, and the light reflection layer being arranged on a face of the microstructure layer facing away from the absorption layer. The microstructure layer is configured such that a light incident on the light reflection layer in a direction perpendicular to the first plane is emitted out obliquely with (Continued)

respect to the first plane after the light is reflected by the light reflection layer. The absorption layer may be formed at a side of the microstructure layer, or on the substrate.

17 Claims, 5 Drawing Sheets

(51) Int. Cl.
*H01L 27/32* (2006.01)
*G02B 5/08* (2006.01)
*H01L 51/52* (2006.01)

(52) U.S. Cl.
CPC ...... *H01L 51/5271* (2013.01); *H01L 51/5284* (2013.01); *H01L 51/56* (2013.01); *H01L 27/322* (2013.01)

(58) Field of Classification Search
USPC .......................................................... 359/609
See application file for complete search history.

(56) References Cited

U.S. PATENT DOCUMENTS

| | | | | |
|---|---|---|---|---|
| 8,624,963 | B2* | 1/2014 | Lim | G02B 27/26 345/419 |
| 9,594,194 | B2* | 3/2017 | Asaoka | G02F 1/1335 |
| 2001/0007488 | A1* | 7/2001 | Sawada | G02B 5/201 349/106 |
| 2004/0113550 | A1* | 6/2004 | Adachi | H01L 27/3246 313/512 |
| 2004/0248048 | A1* | 12/2004 | Lee | H01J 9/242 430/321 |
| 2004/0263062 | A1 | 12/2004 | Fujii | |
| 2006/0066945 | A1* | 3/2006 | Yeo | G02B 3/0031 359/457 |
| 2007/0108881 | A1* | 5/2007 | Choi | G02B 5/00 313/110 |
| 2007/0132378 | A1* | 6/2007 | Cok | H01L 51/5268 313/506 |
| 2008/0007835 | A1* | 1/2008 | Lim | G02B 5/22 359/602 |
| 2008/0238317 | A1* | 10/2008 | Kwon | B29D 7/01 313/582 |
| 2009/0079336 | A1* | 3/2009 | Yamada | H01L 51/5265 313/504 |
| 2010/0053727 | A1* | 3/2010 | Lee | G02B 26/02 359/295 |
| 2010/0090595 | A1 | 4/2010 | Nomura et al. | |
| 2014/0203277 | A1* | 7/2014 | Shimomura | H01L 29/66969 257/43 |
| 2015/0042933 | A1* | 2/2015 | Ueki | G02B 5/0242 349/108 |
| 2017/0133357 | A1* | 5/2017 | Kuo | H01L 25/167 |

FOREIGN PATENT DOCUMENTS

| | | |
|---|---|---|
| CN | 102271219 A | 12/2011 |
| CN | 103185978 A | 7/2013 |
| CN | 103280536 A | 9/2013 |
| CN | 103700688 A | 4/2014 |
| CN | 104716161 A | 6/2015 |
| EP | 1876476 A2 | 1/2008 |
| WO | 2013039141 A1 | 3/2013 |

OTHER PUBLICATIONS

First Chinese Office Action, for Chinese Patent Application No. 201510119208.X, dated Mar. 3, 2017, 13 pages.
Extended European Search Report, for European Patent Application No. 15882905.1, dated Oct. 10, 2017, 7 pages.
Second Chinese Office Action, for Chinese Patent Application No. 201510119208.X, dated Jan. 17, 2018, 15 pages.

* cited by examiner

BLACK MATRIX, FLAT PANEL DISPLAY DEVICE AND METHOD FOR PRODUCING THE SAME

CROSS-REFERENCE TO RELATED APPLICATION

This application claims benefit of Chinese Application No. 201510119208.X, filed with SIPO on Mar. 18, 2015, which is incorporated herein by reference in their entirety.

BACKGROUND OF THE DISCLOSURE

Field of the Disclosure

The present disclosure generally relates to the field of flat panel display, in particular, to a black matrix, a flat panel display device including the black matrix and a method for producing the black matrix or the flat panel display device.

Description of the Related Art

A flat panel display device becomes more and more popular in our lives. An organic electroluminescent device (e.g., OLED) has a wide application prospect and gets great attention due to its properties such as self-emission, high brightness, high efficiency, low weight and thickness, wide angle of view and easy production and advantages such as low driving voltage, large area productability and full color display. In terms of angle of view, it may have a wide angle of view more than 160 degrees in vertical and horizontal directions and has a great experience for a watcher. It also has good brilliancy, high brightness, high contrast to achieve excellent quality of picture. It also has a high response speed, with a response time below 10 μs or even 1 μs for convenience in use. By means of RGB fluorescent material or a color filter, full-color display may be achieved to extend its application range. As a plastic substrate is flexible advantageously, it may achieve a bendable display device. The operation temperature may be in a wide range, from −40 Celsius to 60 Celsius. However, its properties of high brightness, high contrast and low power consumption may degrade the display quality due to disturbance of external illumination. In a typical solution, a layer of circular polarization polarizer is attached to an outer surface of the OLED display. Through the reflection of a metal reflection electrode, an environmental light is absorbed by the polarizer to improve contrast and display effects, but it may cause energy loss.

FIG. 1 is a schematic view showing a conventional black matrix structure provided in a flat panel display device. As illustrated in FIG. 1, the conventional black matrix structure 10 is arranged on a substrate 20 of the flat panel display device and includes a chromic oxide layer 12 arranged on a surface of the substrate 20, a chromic nitride layer 14 arranged on the chromic oxide layer 12 and a chrome layer 16 arranged on the chromic nitride layer 14. Another surface of the substrate 20 is a display surface of the flat panel display device. When the environmental light is incident into the substrate 20, the black matrix structure 10 may absorb part of the environmental light and thus reduce the reflection light caused by the environmental light to improve the contrast of the display device.

SUMMARY

In accordance with an embodiment of the present application, it provides a black matrix, arranged on a surface of a substrate located in a first plane, the black matrix including: a light absorption layer, a microstructure layer and a light reflection layer, the light absorption layer being formed between the microstructure layer and the surface of the substrate, and the light reflection layer being arranged on a face of the microstructure layer facing away from the light absorption layer; wherein the microstructure layer is configured such that a light incident on the light reflection layer in a direction perpendicular to the first plane is emitted out obliquely with respect to the first plane after the light is reflected by the light reflection layer.

In accordance with an embodiment of the present application, it provides a flat panel display device including the black matrix described as above.

In accordance with an embodiment of the present application, it provides a method for producing a black matrix of a flat panel display device, including: providing a substrate and producing a microstructure on a surface of the substrate located in a first plane; producing a light absorption layer on the microstructure; producing a microstructure layer on the light absorption layer; producing a light reflection layer on the microstructure layer, wherein the microstructure layer is configured such that a light incident on the light reflection in a direction perpendicular to the first plane is emitted out obliquely with respect to the first plane after the light is reflected by the light reflection layer.

In accordance with an embodiment of the present application, it provides a method for producing a black matrix of a flat panel display device, including: providing a substrate and producing a light absorption layer on a surface of the substrate located in a first plane; producing a microstructure layer on the light absorption layer; producing a light reflection layer on the microstructure layer, wherein the microstructure layer is configured such that a light incident on the light reflection in a direction perpendicular to the first plane is emitted out obliquely with respect to the first plane after the light is reflected by the light reflection layer.

In accordance with an embodiment of the present application, it provides a method for producing a flat panel display device, including: producing a black matrix on a first substrate by the method as describe above; producing an organic light emitting diode on a second substrate; and aligning and assembling the first substrate with the black matrix and the second substrate with the organic light emitting diode with each other.

DETAILED DESCRIPTION OF EMBODIMENTS

The specific embodiments of the present application will be shown in figures by ways of examples and described specifically in the present text although various modifications and alternative forms for the present application are also desired. However, it should be understood that the accompanied figures and the specific description are not intended to limit the present application to the disclosure, instead, to cover all of modifications, equivalents and alternatives that fall within the spirit and scope of the present application defined by the appended claims. Figures are illustrative, and thus are not drawn in scale.

In accordance with a general concept of an embodiment of the present application, it provides a black matrix, arranged on a surface of a substrate located in a first plane, the black matrix including a light absorption layer, a microstructure layer and a light reflection layer, the light absorption layer being formed between the microstructure layer and the surface of the substrate, and the light reflection layer being arranged on a face of the microstructure layer facing away from the light absorption layer; wherein the microstructure layer is configured such that a light incident on the light reflection layer is emitted out obliquely with respect to the first plane after the light is reflected by the light reflection layer.

Several embodiments of the present application are explained with reference to the accompanied drawing. In addition, for the purpose of explanation, numerous specific details are set forth in the following detailed description to provide a thorough understanding to the embodiments of the present invention. It is obvious, however, that one or more embodiments can also be implemented without these specific details. In other instances, well-known structures and devices are shown in an illustrative manner so as to simplify the drawings.

Figure 1:
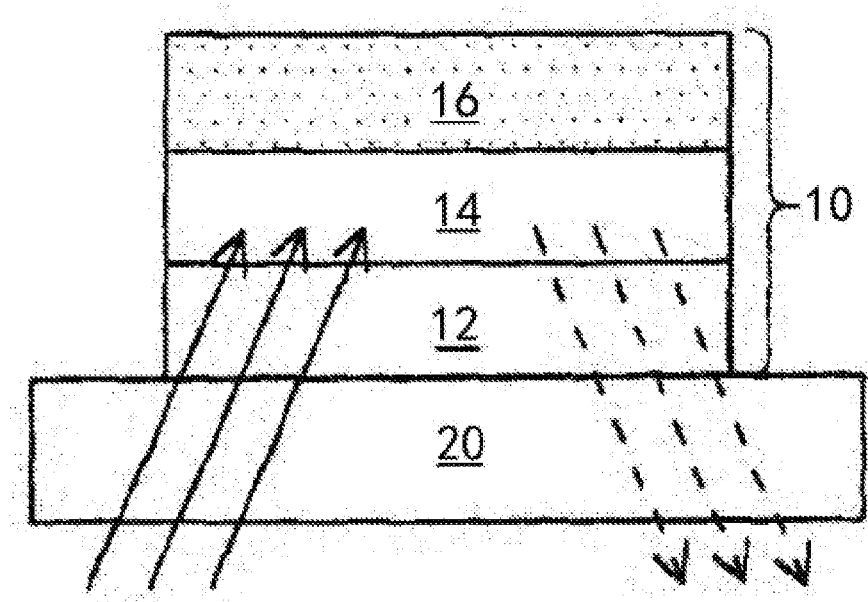
FIG. 1 is a schematic view showing a structure of a black matrix in the prior art.
Figure 2:
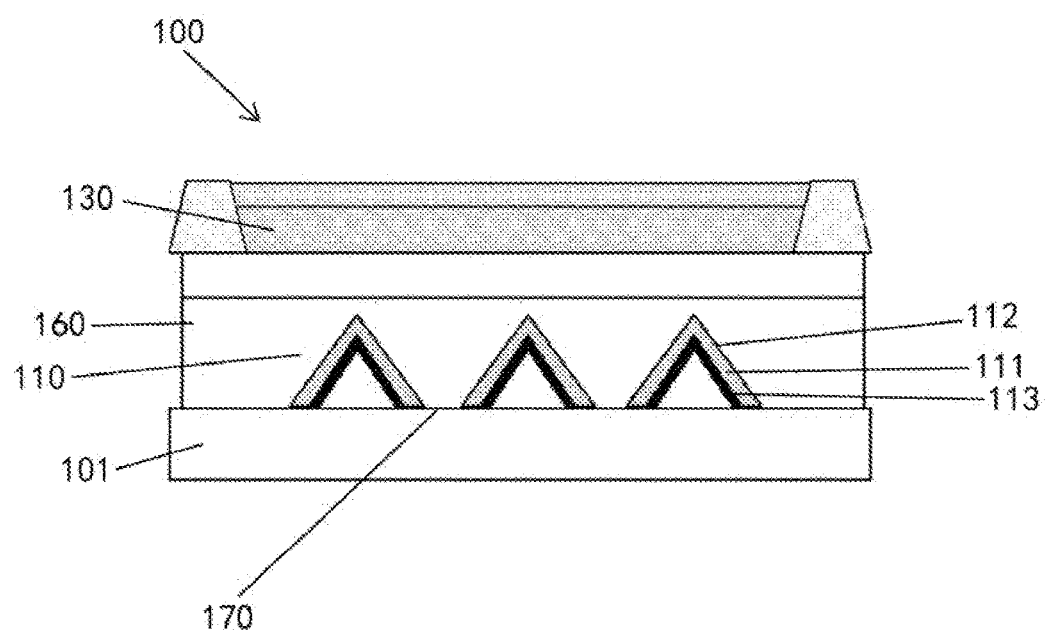
FIG. 2 is a schematic cross-sectional view showing a flat panel display device according to an embodiment of the present application.

FIG. 2 shows a flat panel display device 100 according to an embodiment of the present application. The flat panel display device according to the embodiment of the present application may include a substrate 101. The substrate 101 has a surface (an upper surface in FIG. 2) located in a first plane. As an example, the surface of the substrate 101 may be flat. The flat panel display device may further include a black matrix 110 arranged on the surface of the substrate 101 arranged in the first plane. In FIG. 2, the black matrix 110 is arranged on an upper side of the substrate 101 and a display face side is at a lower side of the substrate 101. A light from external environment is incident on the substrate 101. Part of the environmental light is absorbed by the black matrix 110 to reduce the light reflection of the display face of the flat panel display device 100. In an embodiment of the present application, the black matrix 110 may be arranged in an optical medium layer 160, such as arranged side by side or in an array. Opening areas 170 may be formed among the black matrixes 110.

The black matrix 110 according to an embodiment of the present application may include a microstructure layer 111, a light absorption layer 113 and a light reflection layer 112. The light reflection layer 112 is arranged on a side of the microstructure layer 111 facing away from the light absorption layer 113. The light absorption layer 113 covers at least part of one side of the microstructure layer 111 while the light reflection layer 112 covers at least part of the other side of the microstructure layer 111.

In the black matrix according to an embodiment of the present application, as shown in FIG. 2, the microstructure layer 111 of the black matrix 110 is formed in a shape of prism. In the cross sectional view shown in FIG. 2, the microstructure layer 111 is arranged to form an inclined angle with respect to the first plane, that is, a part of the microstructure layer is at an acute angle with respect to the first plane, or alternatively, another opposed part of the microstructure layer is at an obtuse angle with respect to the first plane. The light absorption layer 113 and the light reflection layer 112 are formed on two sides of the microstructure layer 111 respectively, i.e., the light absorption layer 113 is arranged on the side of the microstructure layer 111 facing towards the substrate 101. A space may be formed between the light absorption layer 113 and the substrate 101. The space formed between the light absorption layer 113 and the substrate 101 may be filled with transparent materials.

In an embodiment, a microstructure is at first formed by transparent materials on the substrate 101, then the light absorption layer 113 which covers at least part of a surface of the microstructure (such as whole surface of the microstructure) is formed on the microstructure, and subsequently, the microstructure layer 111 and the light reflection layer 112 are formed in sequence. The light reflection layer 112 covers at least part of a surface of the microstructure layer (such as whole surface of the microstructure layer).

In an embodiment, the space formed between the light absorption layer 113 and the substrate 101 may not be filled with any materials. At first, the light absorption layer 113 is formed on the surface of the substrate 101, for example, a hollow light absorption layer 113 is formed by a metal layer or an organic material, then a microstructure layer 111 is formed on the light absorption layer 113 and the light reflection layer 112 is formed on the microstructure layer 111 to form the black matrix.

In the black matrix 110 according to an embodiment of the present application, the light reflection layer 112 reflects the light which is perpendicularly incident on the black matrix 110 such that the light which is perpendicularly incident is reflected off the light reflection layer 112 obliquely with respect to the first plane. On the other words, in the embodiment shown in FIG. 2, the light which is incident perpendicular to the first plane is redirected by the light reflection layer 112, reflected obliquely with respect to the first plane, and at least part of the light is emitted through the opening areas among the black matrixes. In this way, the light which is initially incident perpendicularly on the black matrix will not be reflected perpendicularly back (as in the case that the conventional black matrix is planar), but will be reflected towards other directions by the black matrix with reflection faces arranged obliquely, and finally part of light is emitted out through the opening areas.

In the black matrix according to an embodiment of the present application, the light reflection layer 112 may be a material layer having high reflectivity. For example, the light reflection layer 112 may be a metal layer. The light reflection layer 112 may have a thickness of tens of nanometers to several micrometers. The light absorption layer 113 may be made from chrome metal or black resin. The light absorption layer 113 may be made from metal. The light absorption layer 113 may be made from metal compound. The light absorption layer 113 may be made from organic micromolecules, or organic macromolecules, or may be made from other semiconductor materials. The light absorption layer 113 may have a thickness of tens of nanometers to several micrometers. In the black matrix according to the embodiment of the present application, the light absorption layer 113 may be of a multi-layer structure, so as to further enhance the absorption of light, such that the light which is incident on the light absorption layer may be reflected less.

Figure 3:
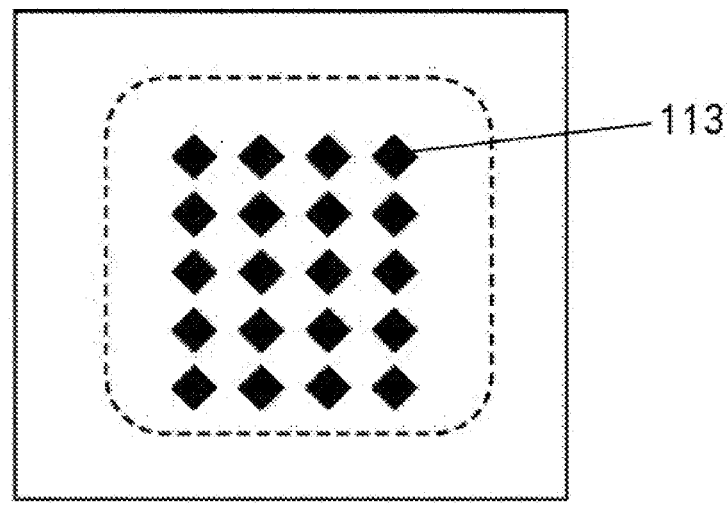
FIG. 3 is a schematic plan view showing a black matrix according to an embodiment of the present application, viewed from a display side.
Figure 4:
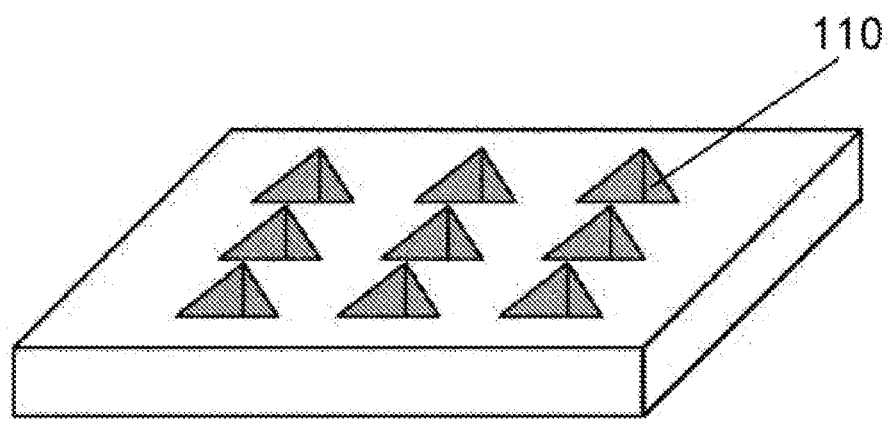
FIG. 4 is a schematic perspective view showing a black matrix according to an embodiment of the present application.

In order to further show the structure of the black matrix 110, FIG. 3 illustrates a plan view of the black matrix 110 observed from a front face of the substrate (i.e., from a display side). FIG. 4 shows a perspective view of the black matrix arranged on the substrate. The black matrix according to an embodiment of the present application may have a shape of prism. The black matrix according to another embodiment of the present application may also have a shape of pyramid. The black matrix according to an embodiment of the present application may also have a shape of tetrahedron. The black matrix in FIG. 2 may have size between hundreds of nanometers and several micrometers. For example, the microstructure layer 111 of the black matrix may have a length between 3 μm and 5 μm and a width between 3 μm and 5 μm. The pitch between the black matrixes may be in a range between less than 10 micrometers and tens of micrometers.

Due to the arrangement of the microstructure layer according to an embodiment of the present application, the distance between the light reflection layer of the black matrix and the light source of an organic light emitting diode in the flat panel display device is reduced. In the embodiment, the position at which the whole black matrix redirects the light is located between the light reflection layer 112 and the organic light emitting diode light source 130. It has a thickness less than 20 μm. From the absorption coefficients of the material in the conventional flat panel display device, it can be determined that the image blur in such structure is not problematic. On the other words, due to the structure according to the embodiment of the present application, the image blur in the flat panel display device is alleviated at least partly.

Figure 5:
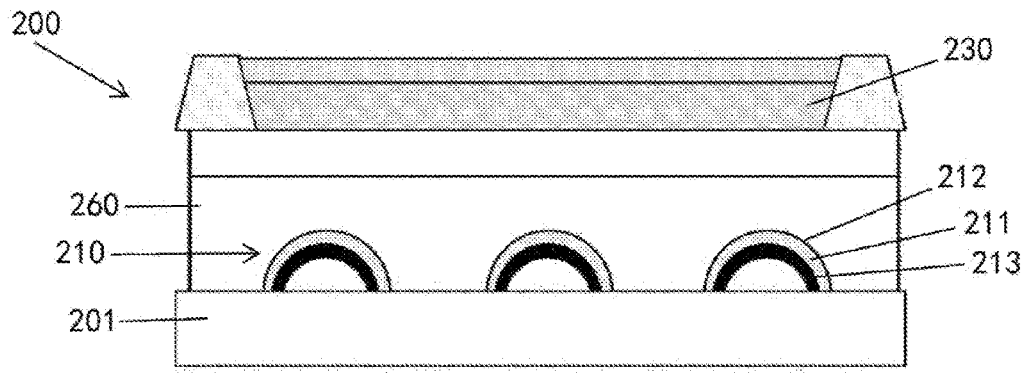
FIG. 5 is a schematic cross-sectional view showing a flat panel display device according to another embodiment of the present application.

FIG. 5 shows a flat panel display device 200 according to another embodiment of the present application. The flat panel display device 200 is substantially same to the flat panel display device 100, except that the black matrix 210 has the following different features. In the flat panel display device 200 according to the embodiment, the black matrix 210 includes a microstructure layer 211 in a shape of semi-sphere and the light reflection layer 212 and the light absorption layer 213 are provided on two opposed sides of the microstructure layer 211 respectively.

The black matrix 210 according to the embodiment of the present application has a shape of semi-sphere. FIG. 5 shows the cross sectional view of the black matrix.

In accordance with an embodiment of the present application, the light absorption layer 213 may be formed by macromolecular material on the substrate 201 and the light absorption layer 213 has a shape of hollow semi-sphere. Then, the microstructure layer 211 is formed on the light absorption layer 213 and subsequently the light reflection layer 212 is formed on the microstructure layer 211.

In accordance with another embodiment of the present application, a microstructure in a shape of semi-sphere is formed by transparent materials on a surface of the substrate 201, then the light absorption layer 213 which covers at least part of the microstructure is formed on the microstructure, and subsequently, the microstructure layer 211 is formed on the light absorption layer 213 and then the light reflection layer 212 is formed on the microstructure layer 211.

Figure 6:
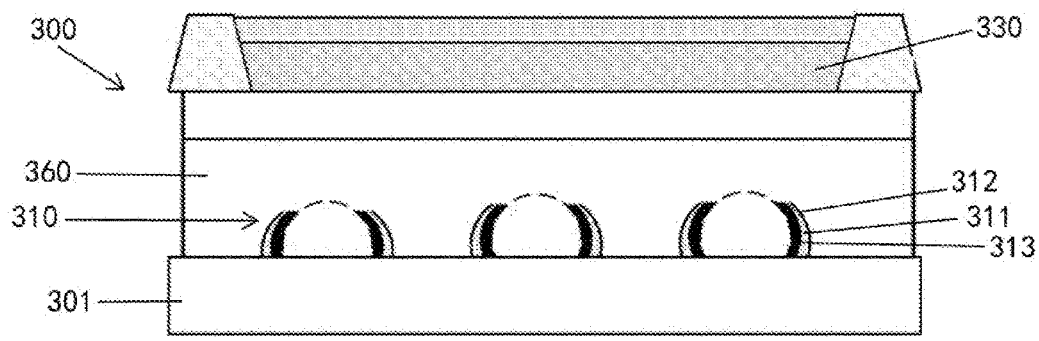
FIG. 6 is a schematic cross-sectional view showing a flat panel display device according to a further embodiment of the present application.

FIG. 6 shows another variant of the black matrix according to an embodiment of the present application. The flat panel display device 300 is substantially same to the flat panel display device 100, except that the black matrix 310 has the following different features. In FIG. 6, the black matrix 310 has a shape of truncated semi-sphere. In contrast to the black matrix 200 shown in FIG. 5, the black matrix 310 includes the microstructure layer 311 in a shape of semi-sphere and the microstructure layer 311 has a top which is not closed. The term of "truncated semi-sphere" herein means a semi-sphere which has an incomplete top, for example, a shape formed by cutting the top of a semi-sphere. That is, in the circumstance of black matrix in a shape of truncated semi-sphere, part of the incident light is not reflected, but is transmitted through the black matrix. In this way, the luminous exitance of the light is enhanced.

In accordance with an embodiment of the present application, a microstructure in a shape of truncated semi-sphere is formed by transparent materials on the substrate 301, then the light absorption layer 313 which covers at least part of the microstructure is formed on the microstructure, and subsequently, the microstructure layer 311 is formed on the light absorption layer 313 and then the light reflection layer 312 is formed on the microstructure layer, so as to form the black matrix shown in FIG. 6.

Figure 7:
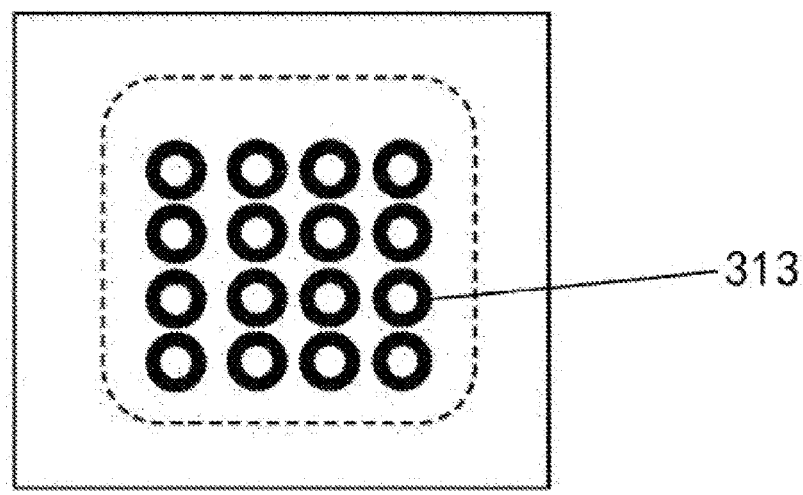
FIG. 7 is a schematic plan view showing a black matrix according to a further embodiment of the present application, viewed from a display side.

FIG. 7 shows another view of the black matrix 310, that is, topography of the black matrix observed from the display side (bottom surface in FIG. 6) of the substrate.

Figure 8:
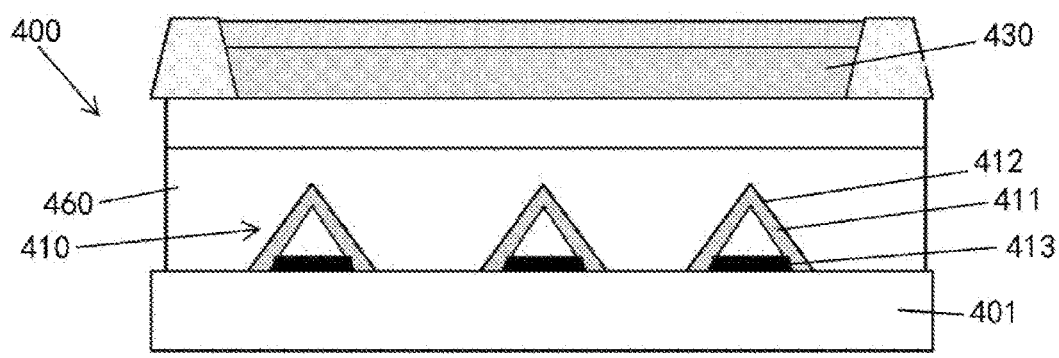
FIG. 8 is a schematic cross-sectional view showing a flat panel display device according to a further embodiment of the present application.

FIG. 8 shows a flat panel display device 400 according to another embodiment of the present application. The flat panel display device 400 is substantially same to the flat panel display device 100, except that the black matrix 410 has the following different features. The flat panel display device 400 includes the black matrix 410. The black matrix 410 includes a microstructure layer 411 and a light reflection layer 412 and a light absorption layer 413 on two opposed sides of the microstructure layer 411. In an embodiment of the present application, as illustrated in FIG. 8, the light absorption layer 413 is arranged on the substrate 401 and the light absorption layer 413 may be a planar laminated structure. The light reflection layer 412 is arranged on a surface at another side of the microstructure layer 411 facing the light absorption layer 413. The microstructure layer 411 may have a shape of tetrahedron. A space may be formed between the light absorption layer 413 and the microstructure layer 411. In an embodiment, the space may be filled with opaque materials. In an embodiment, the space may be filled with transparent materials, that is, the microstructure layer may be a solid structure. In an embodiment, the space may not be filled with materials.

In accordance with an embodiment of the present application, the light absorption layer 413 which is a planar film may at first be formed on the substrate 401, and then a microstructure is formed on the light absorption layer 413. Subsequently, the microstructure layer 411 and the light reflection layer 412 are formed on the microstructure in sequence. The microstructure may be made from transparent materials or opaque materials or semi-transparent materials. The microstructure may for example have a shape selected from an ellipse, an oval, a rhombus, a truncated cone, a truncated oval or a truncated ellipse. The microstructure of the black matrix may have any other shapes. The microstructure of the black matrix is formed such that the light reflection layer on the microstructure changes the orientation of the light which is incident perpendicular to the first plane.

In accordance with an embodiment of the present application, the light absorption layer 413 which is a planar film may at first be formed on the substrate 401 which is located in the first plane, and then a microstructure layer 411 is formed on the light absorption layer 413. Subsequently, the light reflection layer 412 is formed on the microstructure layer 411. In accordance with the embodiment, a hollow space is formed between the microstructure layer 411 and the light absorption layer 413. In the embodiment of the present application, the microstructure layer of the black matrix may for example have a shape selected from an ellipse, an oval, a rhombus, a truncated cone, a truncated oval or a truncated ellipse. The microstructure of the black matrix may have any other shapes. The microstructure layer of the black matrix is formed such that the light reflection layer on the microstructure layer changes the orientation of the light which is incident perpendicular to the first plane.

In this way, by means of changing the travel direction of the incident light by the light reflection layer, at least part of the light may not be defined in a transparent medium layer. For example, the part of the light may be emitted out through the opening areas, so as to enhance the luminous exitance and improve optical coupling efficiency. The above embodiments provide different arrangements and structures of the microstructure layer. The light reflection layer on the microstructure layer thus may have a shape of polyhedron composed of a plurality of planes. Each of the plurality of planes is at an angle of other than 90 degrees with respect to the first plane. Thus, the light reflection layer on the microstructure layer may also have a shape of curve surface. The curve surface of the light reflection layer has a tangential direction at angle of other than 90 degrees with respect to the first plane. And due to properties of the curve surface, the angle between the tangential direction of the curve surface and the first plane may have different values at different portions of the light reflection layer. These surfaces of the light reflection layer at least change the travel direction of part of the light.

In an embodiment of the present application, the light absorption layer may be formed at any position between the microstructure layer and the surface of the substrate. As an example, the light absorption layer may contact or be adhered to one or both of the microstructure layer and the surface of the substrate.

The flat panel display device 100, 200, 300 and 400 according to the embodiments of the present application may further include a light source 130, 230, 330, 430. The light source 130, 230, 330, 430 may include an organic light emitting diode. The flat panel display device 100, 200, 300 and 400 may further include an electrode layer. The flat panel display device may further include other functional layers. The skilled person in the art may provide different functional layers as required in practice.

In accordance with an embodiment of the present application, it provides a method for producing a flat panel display device 100. The method includes: providing a substrate 101 and producing a microstructure in a shape of prism or tetrahedron on a surface of the substrate 101; producing a light absorption layer 113 on the microstructure, the light absorption layer 113 covering at least part of the microstructure; producing a microstructure layer 111 on the light absorption layer; producing a light reflection layer 112 on the microstructure layer 111, the light reflection layer 112 covering at least part of the microstructure layer 111.

The method for producing the flat panel display device 200 in accordance with an embodiment of the present application includes: providing a substrate 201 and producing a microstructure in a shape of semi-sphere on a surface of the substrate 201; producing a light absorption layer 213 on the microstructure; producing a microstructure layer 211 on the light absorption layer; and producing a light reflection layer 212 on the microstructure layer 211.

The method for producing the flat panel display device 300 in accordance with an embodiment of the present application includes: a) providing a substrate 301 and producing a microstructure in a shape of semi-sphere on a surface of the substrate 301; b) producing a light absorption layer 313 on the microstructure; c) producing a microstructure layer 311 on the light absorption layer; d) producing a light reflection layer 312 on the microstructure layer 311. The method for producing the flat panel display device 300 according to the embodiment further includes: truncating the top of the microstructure in a shape of semi-sphere in any one of the steps a), b), c) and d).

In accordance with embodiments of the present application, the above microstructure may have another shape such as a tetrahedron shape, a semi-sphere shape, an elliptical shape, an oval shape, a truncated prism shape, a truncated semi-sphere shape, a truncated elliptical shape, or a truncated oval shape. In accordance with embodiments of the present application, the above microstructure may be transparent. In an embodiment, the above microstructure may be made from light absorption materials.

The method for producing the flat panel display device 400 in accordance with an embodiment of the present application includes: providing a substrate 401 and producing a light absorption layer 413 on the substrate 401; producing a microstructure layer 411 in shape of prism on the light absorption layer 413; producing a light reflection layer 412 on the microstructure layer 411. For the method for producing the flat panel display device 400 of the present embodiment, the microstructure layer 411 may further have another shape such as a semi-sphere shape, an elliptical shape, an oval shape, a truncated prism shape, a truncated semi-sphere shape, a truncated elliptical shape, or a truncated oval shape.

The method for producing the flat panel display device according to the embodiment, includes: producing a black matrix on a substrate by the method as described above; producing an organic light emitting diode on another substrate; and aligning and assembling the substrate with the black matrix and the another substrate with the organic light emitting diode with each other.

The method for producing the flat panel display device according to the embodiment, may further include: producing other functional devices on the another substrate.

The black matrix according to the embodiment of the present application and the flat panel display device including the black matrix may improve capability of absorbing the environmental light while reducing the blocking of the emitting light, that is, the reflection of the light reflection layer of the black matrix to light may be defined within the device while increasing luminous exitance in large angle of view, so as to avoid poor contract of images. Also, the problem of low optical coupling efficiency due to refractivity of the transparent medium in the prior art may be solved.

Some embodiments of the present application presenting the general concept of the present application have been described and illustrated, however, it would be appreciated by those skilled in the art that various modifications of the above embodiments will also fall within the scope of the present invention, without departing from the principles and spirit of the disclosure. The scope of the present application is defined by the appended claims and equivalents thereof.

What is claimed is:

1. A black matrix, arranged on a surface of a substrate located in a first plane, the black matrix comprising: a light absorption layer, a microstructure layer and a light reflection layer, the light absorption layer being formed between the microstructure layer and the surface of the substrate, and the light reflection layer being arranged on a face of the microstructure layer facing away from the light absorption layer;

wherein the microstructure layer is configured such that light incident on the light reflection layer from a side of the light reflection layer away from the light absorption layer in a direction perpendicular to the first plane is emitted out obliquely with respect to the first plane after the light is reflected by the light reflection layer, and wherein the light absorption layer covers only a part of a surface of the microstructure layer facing towards the surface of the substrate and the light reflection layer covers only a part of another surface of the microstructure layer facing away from the light absorption layer.

2. The black matrix according to claim 1, wherein the light absorption layer is formed on a surface of the microstructure layer facing towards the surface of the substrate.

3. The black matrix according to claim 1, wherein the microstructure layer is formed such that the light reflection layer is not perpendicular to the first plane.

4. The black matrix according to claim 1, wherein the microstructure layer is formed such that an angle between a tangential direction of the light reflection layer and the first plane has different values at different portions of the light reflection layer.

5. The black matrix according to claim 1, wherein the light reflection layer is a metal layer.

6. The black matrix according to claim 1, wherein the black matrix has a shape selected from any one of a prism shape, a tetrahedron shape, a semi-sphere shape, an oval shape, an elliptical shape, a truncated cone shape, a truncated semi-sphere shape, a truncated oval shape or a truncated elliptical shape.

7. The black matrix according to claim 1, wherein the black matrix further comprises a microstructure made from transparent material and the light absorption layer is formed on the microstructure.

8. A flat panel display device, comprising the black matrix according to claim 1.

9. The flat panel display device according to claim 8, comprising a plurality of the black matrixes arranged side by side, wherein opening regions which are transmittable to light are formed between the plurality of the black matrixes.

10. A method for producing a black matrix of a flat panel display device, comprising:
providing a substrate and producing a microstructure on a surface of the substrate located in a first plane;
producing a light absorption layer on the microstructure;
producing a microstructure layer on the light absorption layer; and
producing a light reflection layer on the microstructure layer, wherein the microstructure layer is configured such that light incident on the light reflection layer in a direction perpendicular to the first plane is emitted out obliquely with respect to the first plane after the light is reflected by the light reflection layer, and
wherein the light absorption layer covers only a part of a surface of the microstructure layer facing towards the surface of the substrate and the light reflection layer covers only a part of another surface of the microstructure layer facing away from the light absorption layer.

11. A method for producing a black matrix of a flat panel display device, comprising:
providing a substrate and producing a light absorption layer on a surface of the substrate located in a first plane;
producing a microstructure layer on the light absorption layer; and
producing a light reflection layer on the microstructure layer,
wherein the microstructure layer is configured such that light incident on the light reflection layer from a side of the light reflection layer away from the light absorption layer in a direction perpendicular to the first plane is emitted out obliquely with respect to the first plane after the light is reflected by the light reflection layer, and
wherein the light absorption layer covers only a part of a surface of the microstructure layer facing towards the surface of the substrate and the light reflection layer covers only a part of another surface of the microstructure layer facing away from the light absorption layer.

12. The method according to claim 10, wherein the microstructure layer is formed such that the light reflection layer is not perpendicular to the first plane.

13. The method according to claim 10, wherein the microstructure layer is formed such that an angle between a tangential direction of the light reflection layer and the first plane has different values at different portions of the light reflection layer.

14. The method according to claim 10, wherein the light reflection layer is a metal layer.

15. The method according to claim 10, wherein the black matrix has a shape selected from any one of a prism shape, a tetrahedron shape, a semi-sphere shape, an oval shape, an elliptical shape, a truncated cone shape, a truncated semi-sphere shape, a truncated oval shape or a truncated elliptical shape.

16. A method for producing a flat panel display device, comprising:
producing a black matrix on a first substrate by the method according to claim 10;
producing an organic light emitting diode on a second substrate; and
aligning and assembling the first substrate with the black matrix and the second substrate with the organic light emitting diode with each other.

17. A method for producing a flat panel display device, comprising:
producing a black matrix on a first substrate by the method according to claim 11;
producing an organic light emitting diode on a second substrate; and
aligning and assembling the first substrate with the black matrix and the second substrate with the organic light emitting diode with each other.

* * * * *